(12) United States Patent
Brask et al.

(10) Patent No.: US 7,485,503 B2
(45) Date of Patent: Feb. 3, 2009

(54) DIELECTRIC INTERFACE FOR GROUP III-V SEMICONDUCTOR DEVICE

(75) Inventors: Justin K. Brask, Portland, OR (US); Suman Datta, Beaverton, OR (US); Mark L. Doczy, Beaverton, OR (US); James M. Blackwell, Portland, OR (US); Matthew V. Metz, Hillsboro, OR (US); Jack T. Kavalieros, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 399 days.

(21) Appl. No.: 11/292,399

(22) Filed: Nov. 30, 2005

(65) Prior Publication Data

US 2007/0123003 A1    May 31, 2007

(51) Int. Cl.
*H01L 21/335*  (2006.01)
*H01L 21/338*  (2006.01)
*H01L 27/108*  (2006.01)

(52) U.S. Cl. .............. 438/142; 438/172; 257/183; 257/310; 257/E31.019; 257/E31.033

(58) Field of Classification Search ........... 438/142, 438/172; 257/183, 310, E31.019, E31.033
See application file for complete search history.

(56) References Cited

U.S. PATENT DOCUMENTS

| | | |
|---|---|---|
| 4,751,201 A | 6/1988 | Nottenburg et al. |
| 4,871,692 A * | 10/1989 | Lee et al. ............ 438/779 |
| 4,914,059 A | 4/1990 | Nissim et al. |
| 2003/0080332 A1 | 5/2003 | Phillips |
| 2005/0062082 A1 * | 3/2005 | Bucher et al. ............ 257/288 |
| 2006/0148182 A1 | 7/2006 | Datta et al. |

FOREIGN PATENT DOCUMENTS

| | | |
|---|---|---|
| EP | 0 265 314 A1 | 4/1988 |
| EP | 0 469 604 A2 | 2/1992 |
| EP | 0 474 952 A1 | 3/1992 |
| JP | 05 090252 A | 4/1993 |
| JP | 06 132521 | 5/1994 |
| WO | WO 91/06976 | 5/1991 |

OTHER PUBLICATIONS

K.Y. Park et al. Device Characteristics of AlGaN/GaN MIS-HFET Using Al2O3-HfO3 Laminated High-k Dielectric, Japan.Jourm of Appl.Phys. vol. 43, 2004, pp. L1433-L1435.*

H.W.Jang et al. "Incorporation of Oxygen Donors in AlGaN", J.Electrochem Soc. 152, pp. G536-G540, (2004).*

Bednyi, et al "Electronic State of the Surface of INP Modified by Treatment in Sulfur Vapor," Soviet Physics Semiconductors, Am. Inst. of Physics, New York, vol. 26, No. 8, Aug. 1, 1992.

(Continued)

*Primary Examiner*—Asok K Sarkar
*Assistant Examiner*—Julia Slutsker
(74) *Attorney, Agent, or Firm*—Blakely, Sokoloff, Taylor & Zafman LLP

(57) ABSTRACT

A Group III-V Semiconductor device and method of fabrication is described. A high-k dielectric is interfaced to a confinement region by a chalcogenide region.

13 Claims, 6 Drawing Sheets

OTHER PUBLICATIONS

Datta, et al "85nm Gate Length Enhancement and Depletion Mode InSb Quantum Well Transistors for Ultra High Speed and Very Low Power Digital logic Applications," IEEE Dec. 5, 2005, pp. 763-766.

Ashley, et al "InSb-based Quantum Well Transistors for High Speed, Low Power Applications," QinetiQ, Malvern Technology Center and Intel (2004) 2 pages.

Park K-Y, et al "Device Characteristics of AlGaN/GaN MIS-HFET Using $Al_2O_3$-$HfO_2$ Laminated High-k Dielectric," Japanese Jnl of Applied Physics, vol. 32, No. 11A (2004) 3 pages.

PCT Search Report, PCT/US2006/044601, mailing date Mar. 19, 2007, 7 pages.

* cited by examiner

DIELECTRIC INTERFACE FOR GROUP III-V SEMICONDUCTOR DEVICE

FIELD OF THE INVENTION

The invention relates to the field of Group III-V semiconductor devices.

PRIOR ART AND RELATED ART

Most integrated circuits today are based on silicon, a Group IV element of the periodic table. Compounds of Group III-V elements such as gallium arsenide (GaAs), indium antimonide (InSb), and indium phosphide (InP) are known to have far superior semiconductor properties than silicon, including higher electron mobility and saturation velocity. Unlike the Group III-V compounds, silicon easily oxidizes to form an almost perfect electrical interface. This gift of nature makes possible the near total confinement of charge with a few atomic layers of silicon dioxide. In contrast, oxides of Group III-V compounds are of poor quality, for instance they contain defects, trap charges, and are chemically complex.

Quantum well field-effect transistors (QWFET) have been proposed based on a Schottky metal gate and an InSb well. They show promise in lowering active power dissipation compared to silicon-based technology, as well as improved high frequency performance. Unfortunately, the off-state gate leakage current is high because of the low Schottky barrier from Fermi level pinning of the gate metal on, for example, an InSb/AlInSb surface.

The use of a high-k gate insulator has been proposed for QWFETs. See, as an example, Ser. No. 11/0208,378, filed Jan. 3, 2005, entitled "QUANTUM WELL TRANSISTOR USING HIGH DIELECTRIC CONSTANT DIELECTRIC LAYER." However, there are problems in interfacing between a high-k material and, for instance, the InSb/AlInSb surface.

DETAILED DESCRIPTION

Processes and devices are described in connection with interfacing a high k dielectric with a Group III-V confinement region in a semiconductor device. In the following description, numerous specific chemistries are described, as well as other details, in order to provide a thorough understanding of the present invention. It will be apparent to one skilled in the art, that the present invention may be practiced without these specific details. In other instances, well-known processing steps are not described in detail in order not to unnecessarily obscure the present invention.

Figure 1:
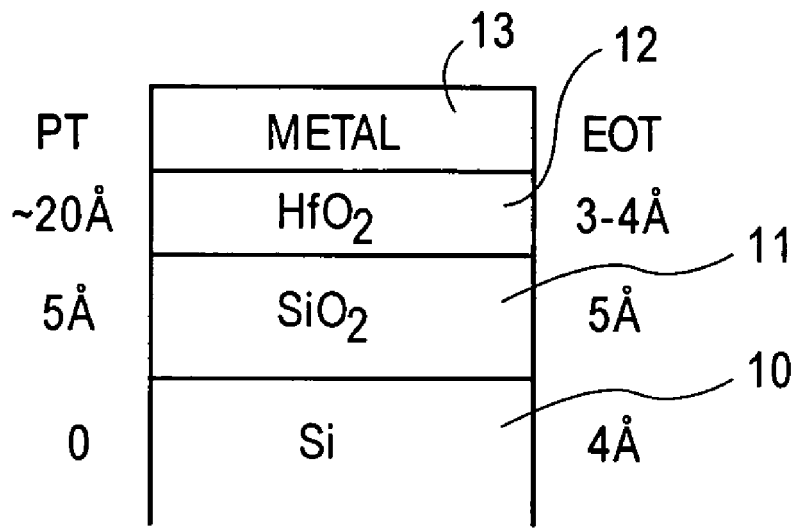
FIG. 1 illustrates a prior art high k dielectric interface between a silicon substrate and a metal gate.

FIG. 1 illustrates an interface between a metal gate 13 and a monocrystalline silicon body or substrate 10. Most typically, the silicon 10 comprises the channel region of a field-effect transistor with a gate 13 for controlling the transistor. Such devices perform particularly well when the equivalent oxide thickness (EOT) of the insulation between the channel region and gate is in the range of 5-30 Å and preferably in the range of 10-15 Å. While silicon dioxide ($SiO_2$) provides an excellent dielectric, with layers this thin, it is difficult to obtain a reliable silicon dioxide dielectric. Rather, high k materials (e.g. dielectric constant of 10 or greater) are used. As shown in FIG. 1, a silicon dioxide region 11 is first formed (or is native) on the silicon 10. Then, a high k dielectric 12 such as hafnium dioxide ($HfO_2$) is formed on the silicon dioxide region 11. Next, a metal gate, typically with a targeted work function, is formed on the high k dielectric. The high k dielectric such as $HfO_2$ or zirconium dioxide ($ZrO_2$) provides an excellent interface. The high k dielectric may be formed in a low temperature deposition process utilizing an organic precursor such as an alkoxide precursor for the $HfO_2$ deposition in an atomic layer deposition (ALD) process. The metal gate, formed with electron beam evaporation or sputtering, may be a platinum, tungsten, palladium, molybdenum or other metals.

The EOT, as shown to the right of the structure of FIG. 1, includes approximately 4 Å associated with the upper surface of the silicon 10, resulting from defects near the surface of the monocrystalline structure. Above this, approximately 5 Å of silicon dioxide region 11 is shown. Then, the high k dielectric is formed in the ALD process, its EOT is 3-4 Å. The resultant EOT for the structure shown in FIG. 1 is 12-13 Å.

To the left of the structure of FIG. 1, the physical thickness (PT) of the regions is shown. As can be seen, the high k dielectric is relatively thick (approximately 20 Å) when compared to the $SiO_2$ region 11. This relatively thick region allows the formation of a reliable, high quality dielectric with a low EOT (3-4 Å).

As mentioned earlier, it is difficult to produce the corresponding interface to the structure of FIG. 1, where a Group III-V compound is used. The oxide formed from these compounds are of poor quality, and do not adhere well to the high k dielectric.

Figure 2:
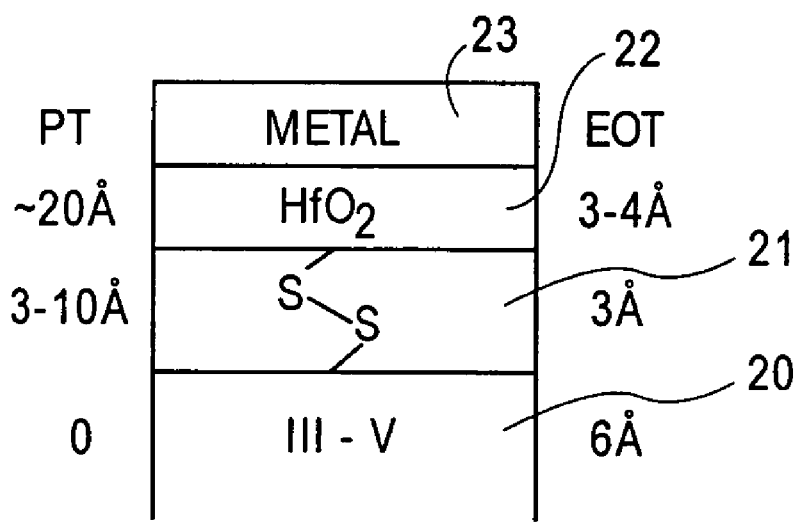
FIG. 2 illustrates the interface between a Group III-V confinement region and a metal gate, including a high k dielectric and a chalcogenide region as described below.

In FIG. 2, the interface, more fully described below, between a Group III-V compound and a high k dielectric is illustrated. A Group III-V region 20 is illustrated with the bridging sulfur (S) atoms of the interface region 21, as one embodiment of a chalcogenide interface region. As will be described, these bridging atoms allow a better match to the high k dielectric region 22, illustrated as $HfO_2$ for one embodiment.

Figure 3:
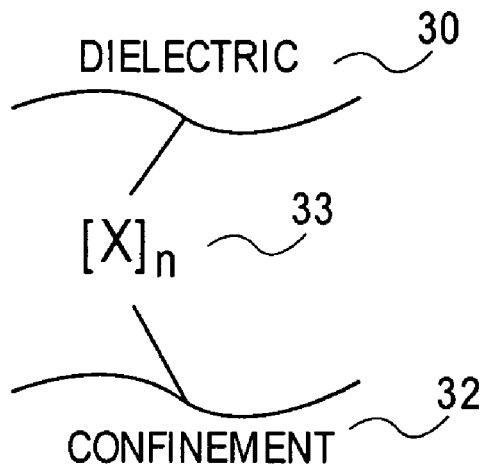
FIG. 3 illustrates a confinement region interfaced with a high k dielectric through a chalcogenide region.

The EOT for the structure of FIG. 3 includes approximately 6 Å associated with the upper surface of the Group III-V compound, such as a confinement region 20, and particularly, native oxides on this region which are not entirely removed as well as lattice defects in the confinement region. The interface 21 may be a chalcogenide such as oxygen (O), S, selenium (Se), tellurium (Te). (The heavier chalcogenide polonium (Po) is not favored because of its radioactivity.) The EOT of the interface region 21 is approximately 3 Å for the illustrated embodiment, corresponding to a few atomic layers. The PT for this region is 3-10 Å. Above this, a high k dielectric region 22 is formed having a PT of approximately 20 Å and an EOT of 3-4 Å. Finally, a metal gate 23, similar to the metal gate 13 of FIG. 1, is used.

In a typical transistor, a quantum well of, for instance, InSb is confined between metamorphic buffer or confinement layers (e.g. AlInSb). These layers have a higher band gap than the well to mitigate the effects of the narrow band gap of the quantum well on device leakage and breakdown.

In FIG. 3, the chalcogenide interface region is again shown between dielectric region 30 and a Group III-V confinement region 32. The chalcogenide is represented by "X," with the number of atomic layers shown as "n." For oxygen, n is typically greater than 1, for example, three. A sterically okioxidizing agent (e.g. di-tert-butyl peroxide or di-iso-propyl-peroxide) may be used to deliver an o-containing substituent with a bulky leaving group (e.g. O-t Bu) which also reacts favorably with a standard ALD precursor. This prevents further reactivity with the atmosphere. The S or Se is preferably equal to 1, 2 or 3. This film may deposited from a monovalent dimer. Any one of a plurality of di-organic di-chalcogenide species can be used.

Figure 5:
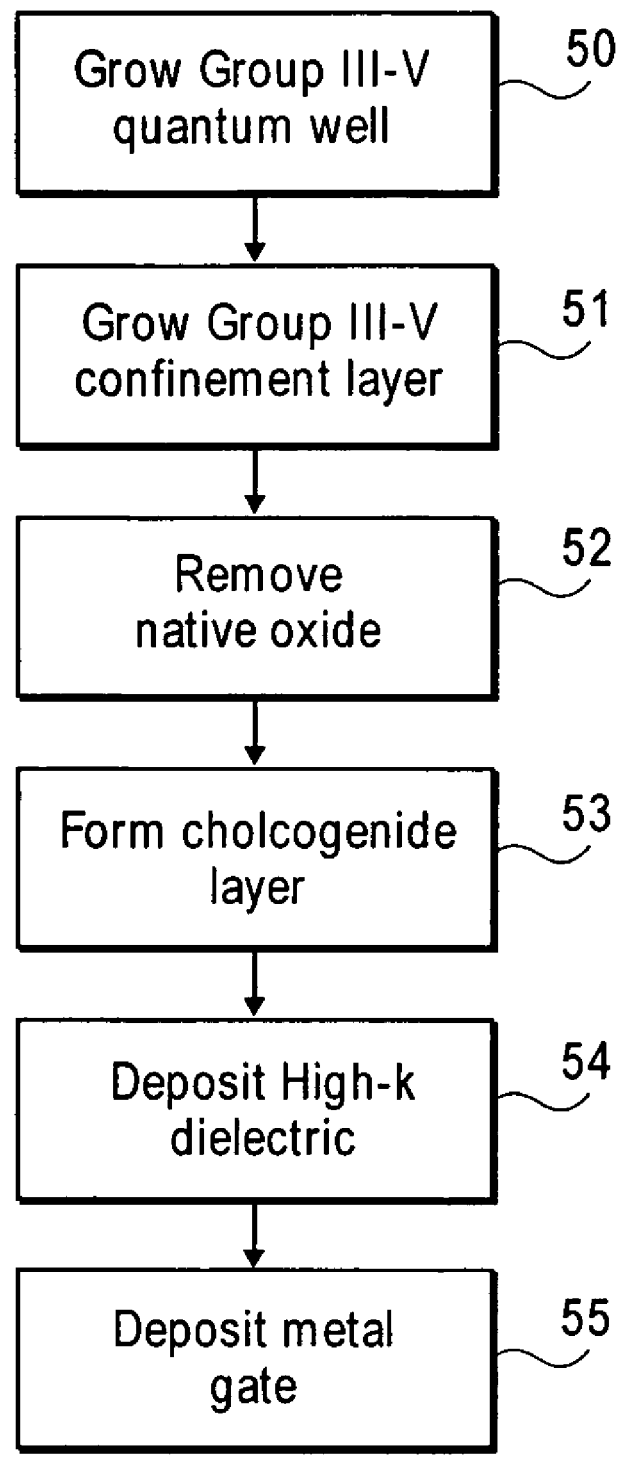
FIG. 5 illustrates the process carried out for forming a metal gate in a Group III-V semiconductor device.

In FIG. 5, a process is illustrated beginning with the growth of the Group III-V quantum well 50 which typically occurs over a first confinement layer. Again, as mentioned, the Group III-V well may comprise InSb or InP. As mentioned, in another process 51, the confinement region or layer is formed on the quantum well. This corresponds to, for instance, region 20 of FIG. 2. The confinement layers are typically a material compatible with the well, however with a larger bandgap. For a well of InSb, the metalloid AlInSb may be used. The processes 50 and 51 may be carried out using molecular beam epitaxy or metal organic chemical vapor deposition, by way of example.

Prior to forming a chalcogenide layer, the native oxide and any other oxide on the confinement layer are removed. The process 52 of FIG. 5 may be carried out by treating the surface with an acid, for instance, citric acid, HCl or HF.

Figure 4A:
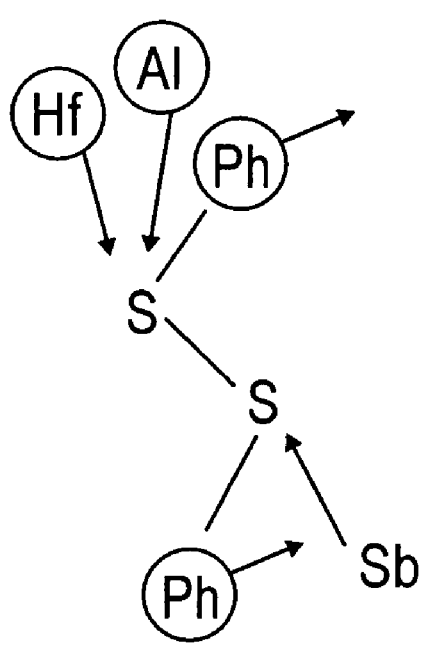
FIG. 4A illustrates a diphenyl-disulfide compound, with the phenyls being replaced.
Figure 4B:
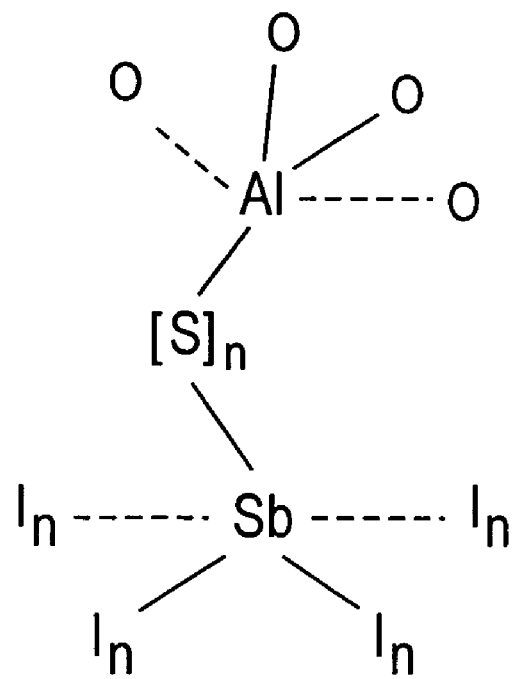
FIG. 4B illustrates the compound of FIG. 4A in place between the confinement region and a high k dielectric.

Next, as shown by process 53, the chalcogenide layer is formed. This formation is shown for one embodiment in conjunction with FIGS. 4A and 4B. In FIG. 4A, a compound of di-phenyl-disulfide is shown which ultimately leaves a chalcogenide film juxtaposed between the metalloid-containing Group III-V confinement region and high k dielectric. Other di-chalcogenide may be used such as di-selenide. Moreover, other precursors such as a benzene ring, or the like may be used. In the case of the di-phenyl, one phenyl is shown displaced by an antimony atom of the confinement layer, and the other with, for instance, Hf or Al atom from one of the precursors used in the formation of the high k dielectric. This leaves, as shown in FIG. 4B, the S bridging atoms where the di-chalcogenide comprises S. Thus, one of the di-phenyl atoms is replaced during the process 53, and the other during the process 54 of FIG. 5, by the precursors for the high k dielectric. The same result can be achieved with the other di-chalcogenide. Ordinary precursors for the formation of the $HfO_2$ or $ZrO_2$ may be used.

In one embodiment, the containment layer is AlInSb, as mentioned. Where this is used, $Al_2O_3$ may be used as the high k dielectric to minimize valence mismatch. The $Al_2O_3$ may be deposited using trimethylaluminum (TMA) and water precursors with an ALD process.

Finally, as shown in FIG. 5, a metal gate deposition 55 occurs. Again, ordinary processing may be used to form the gate. Since the Group III-V material may have a low melting point, for example 525° C. for InSb, ALD is used in one embodiment for the gate deposition. Where $Al_2O_3$ is used as the high k dielectric, an aluminum gate may be used to provide more compatibility.

Figure 6:
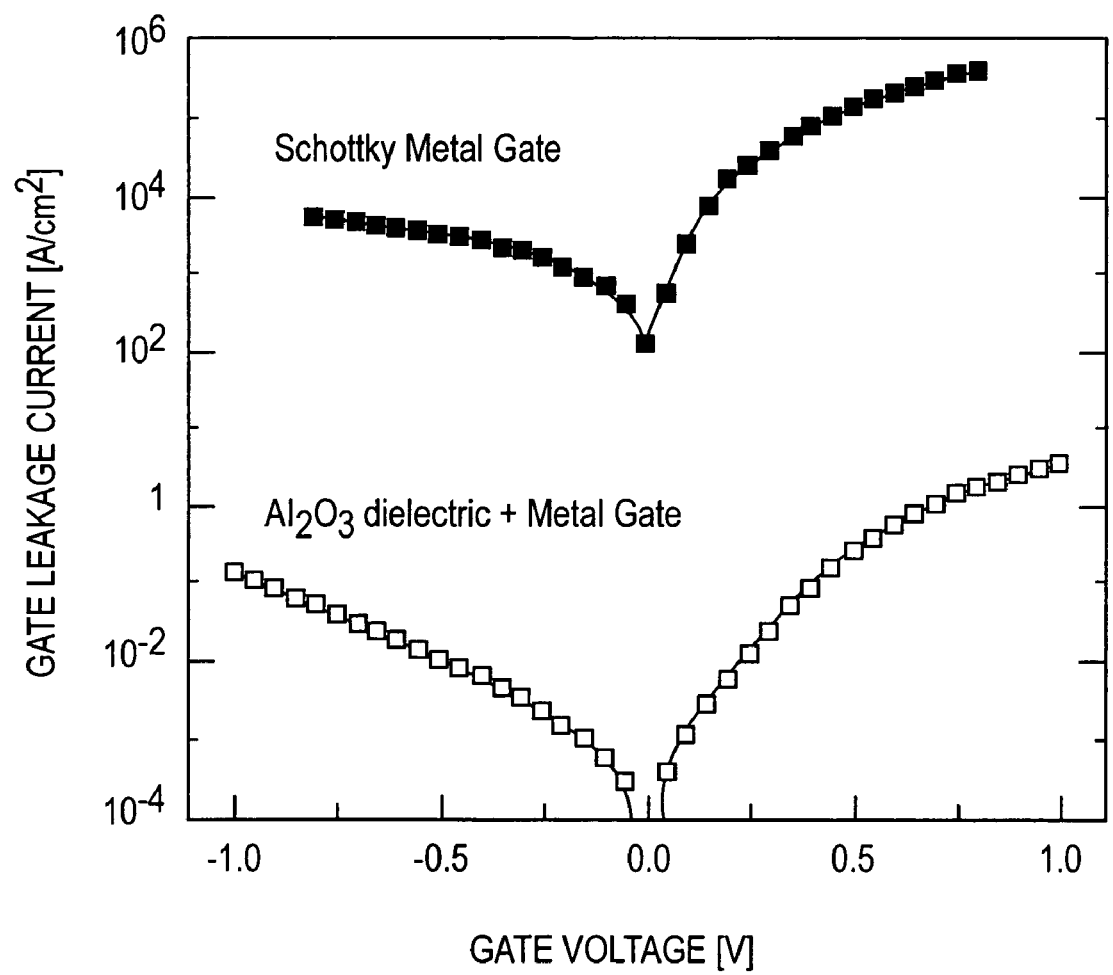
FIG. 6 is a graph illustrating the benefits of using a high k dielectric on the gate leakage when compared to a Schottky metal gate.

FIG. 6 illustrates the reduction in gate leakage obtained by using a high k dielectric such as $Al_2O_3$ and a metal gate, as opposed to a Schottky metal gate. As can be readily seen in FIG. 6, the difference in leakage is several orders of magnitude less with a high k dielectric. The results of FIG. 6 are for an aluminum gate, $Al_2O_3$ dielectric, AlInSb confinement layer and an InSb quantum well.

Figure 7:
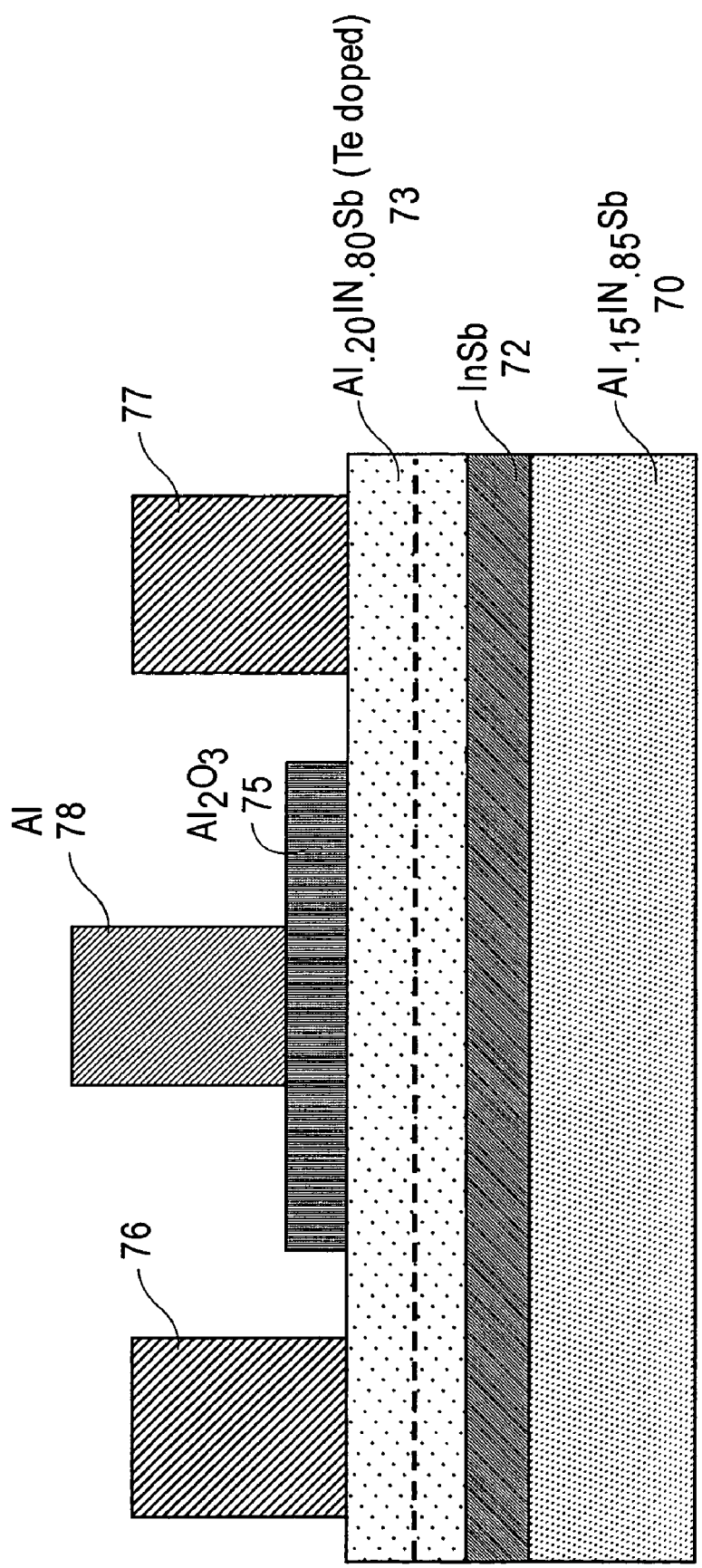
FIG. 7 is a cross-sectional, elevation view of a semiconductor device with an alumina ($Al_2O_3$), high k dielectric layer.

FIG. 7 illustrates the structure of a transistor that may be fabricated with the above-described processing. This embodiment is particularly suitable for a depletion mode-like device since, for instance, when the gate is not embedded into the confinement layer as it is for the device of FIG. 8. A lower containment region, in one embodiment, comprising a $Al_{15}In_{85}Sb$ layer 70 which is formed, for example, on a semi-insulating GaAs substrate. Then, the quantum well 72 of, for instance, InSb is grown on the lower confinement layer. Next, the upper confinement layer 73 comprising, in one embodiment, $Al_{20}In_{80}Sb$ is formed. This layer includes a donor region, more specifically, in one embodiment, a Te doped region. The Te doping supplies carriers to the quantum well 73. The multilayer structure of FIG. 7 may be grown using molecular beam epitaxy or metal organic chemical vapor deposition. The doped donor region is formed by allowing Te (or Si) dopants to flow into the molecular beam epitaxy chamber from, for example, a solid source.

The thickness of the layer 73, along with the work function of the gate 78, determine the threshold voltage of the transistor, and as mentioned earlier, provide for the embodiment of FIG. 7, a depletion mode-like device. A lower work function is thus selected for the gate to reduce the threshold voltage. A source contact 76 and drain contact 77 are also illustrated in FIG. 7, along with an aluminum gate 78. By way of example, in one embodiment, layer 70 may be 3 μm thick, the quantum well 72 may be 20 nm thick, the confinement layer 73 may be 5 nm thick, and the Te, δ-doped donor region may be doped to a level of $1-1.8 \times 10^{12}$ cm$^{-2}$, μ equal to 18-25000 cm$^{-2}$ v$^{-1}$s$^{-1}$ with a gate length of 85 nm.

Figure 8:
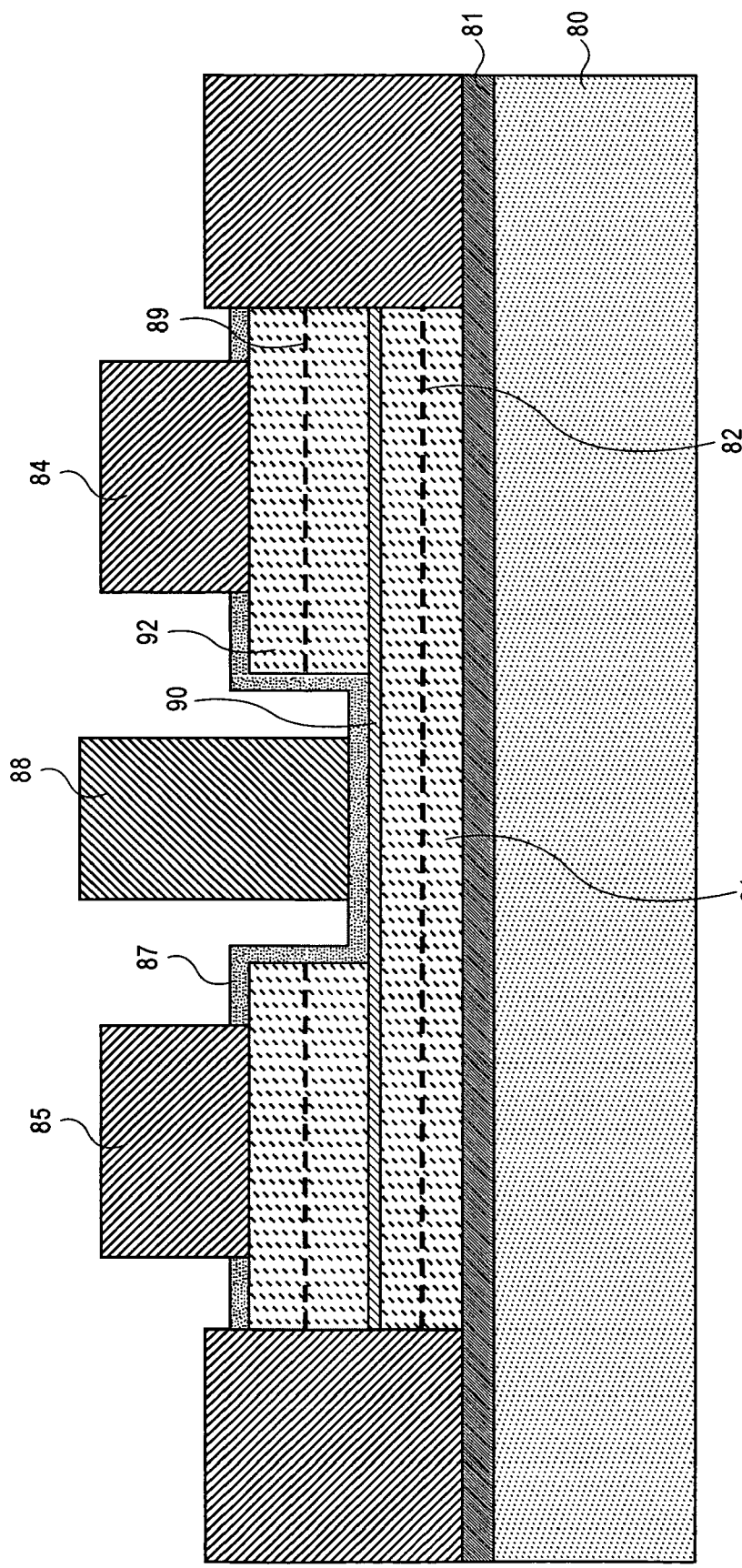
FIG. 8 is a cross-sectional, elevation view of a Group III-V semiconductor device with a high k dielectric and a recessed metal gate.

FIG. 8 illustrates another embodiment with a recessed gate for increasing the voltage threshold to provide a more enhancement mode-like device. Again, there is a higher band gap, lower confinement layer 80, a quantum well 81, and two doped upper confinement layers 91 and 92 separated by an etchant stop layer 90. Both layers 91 and 92 are doped as shown by the δ doping planes 82 and 89, respectively. The high k dielectric 87 is recessed into the layer 92 as is the metal gate 88. It is this recessing and the selection of the work function metal for the gate 88 which provides the increased threshold voltage. The layer thicknesses, doping levels, etc. may be the same as for the embodiment of FIG. 7. The additional layer 92 may be a thickness of 45 nm.

Thus, an interface in several embodiments, between a Group III-V confinement region and a high k dielectric region has been described along with devices using the interface.

What is claimed is:

1. A method for fabricating a semiconductor device comprising:
   growing a first region of a Group III-V compound;
   growing a confinement region on the first region;
   forming a chalcogenide region on the confinement region;
   forming a dielectric region on the chalcogenide region, wherein the chalcoenide reion comrises an $[o]_n$ bridge between the confinement reion and the dielectric region, where n is greater than 1; and
   forming a metal gate on the dielectric region.

2. The method of claim 1, including the removal of a native oxide from the confinement region prior to forming the chalcogenide region.

3. The method of claim 1, wherein the dielectric region comprises a high-k dielectric.

4. The method of claim 3, wherein the high-k dielectric comprises $HfO_2$.

5. A semiconductor device comprising:
   a compound of Group III-V elements in a first region;
   a confinement region having a wider band gap than the first region;
   a chalcogenide region disposed on the confinement region;
   a dielectric region disposed on the chalcogenide region, wherein the chalcogenide region comprises an O bridge between the confinement region and the dielectric region, where n is greater than 1; and
   a metal gate disposed on the dielectric region.

6. The method of claim 1, wherein the chalcogenide region is formed by using a precursor selected from the group consisting of di-tert-butyl peroxide and di-iso-propyl peroxide.

7. The method of claim 5, wherein the native oxide is removed by an etchant selected from the group consisting of citric acid, HCl and HF.

8. The method of claim 1, wherein the first region comprises InSb or InP.

9. The method of claim 1, wherein n is equal to 3.

10. The semiconductor device of claim 5, wherein the dielectric region comprises a high-k dielectric.

11. The semiconductor device of claim 10, wherein the high-k dielectric comprises $HfO_2$.

12. The semiconductor device of claim 5, wherein the first region comprises InSb or InP.

13. The semiconductor device of claim 5, wherein n is equal to 3.

* * * * *

UNITED STATES PATENT AND TRADEMARK OFFICE
CERTIFICATE OF CORRECTION

PATENT NO. : 7,485,503 B2  Page 1 of 1
APPLICATION NO. : 11/292399
DATED : February 3, 2009
INVENTOR(S) : Brask et al.

It is certified that error appears in the above-identified patent and that said Letters Patent is hereby corrected as shown below:

In column 4, at line 64 delete, "chalco enide re ion corn rises" and insert --chalcogenide region comprises--.

In column 4, at line 65 delete, "re ion" and insert --region--.

In column 5, at line 10 delete, "111-V" and insert --III-V--.

In column 5, at line 15 delete, "chalco enide re ion com rises an 0 brid e" and insert --chalcogenide region comprises an [0]$n$ bridge--.

Signed and Sealed this

Twenty-fourth Day of August, 2010

David J. Kappos
*Director of the United States Patent and Trademark Office*